(12) United States Patent
Shima et al.

(10) Patent No.: US 8,299,822 B2
(45) Date of Patent: Oct. 30, 2012

(54) DRIVER AND OUTPUT BUFFER CIRCUIT

(75) Inventors: Yasuo Shima, Ome (JP); Katsuya Sonoyama, Fussa (JP); Yoichiro Kobayashi, Ome (JP)

(73) Assignee: Hitachi, Ltd., Tokyo (JP)

( * ) Notice: Subject to any disclaimer, the term of this patent is extended or adjusted under 35 U.S.C. 154(b) by 110 days.

(21) Appl. No.: 12/987,095

(22) Filed: Jan. 8, 2011

(65) Prior Publication Data
US 2011/0234263 A1 Sep. 29, 2011

(30) Foreign Application Priority Data
Mar. 26, 2010 (JP) .................................. 2010-071288

(51) Int. Cl.
*H03K 3/335* (2006.01)
(52) U.S. Cl. ............. 327/109; 327/112; 326/82; 326/87
(58) Field of Classification Search .......................... None
See application file for complete search history.

(56) References Cited

U.S. PATENT DOCUMENTS
6,323,675 B1 * 11/2001 Whitworth et al. ............. 326/30
7,521,971 B2 * 4/2009 Yamazaki ...................... 327/112

FOREIGN PATENT DOCUMENTS
JP           64-004106 A      1/1989
* cited by examiner

*Primary Examiner* — An Luu
(74) *Attorney, Agent, or Firm* — Miles & Stockbridge P.C.

(57) ABSTRACT

A driver circuit transmits a signal generated by a signal level generation circuit to a circuit to be measured by transmitting the signal to a output buffer circuit via a circuit (prebuffer circuit) that drives the output buffer circuit and causing the output buffer circuit to drive a transmission line. The driver circuit includes the prebuffer circuit and a replica buffer circuit formed by imitating the prebuffer circuit. The prebuffer circuit and the replica buffer circuit are disposed in parallel. The driver circuit temporarily increases input bias current to be supplied to output-stage transistors of the output buffer circuit on the basis of output current of the replica buffer circuit during transition of an input or output signal.

8 Claims, 6 Drawing Sheets

DRIVER AND OUTPUT BUFFER CIRCUIT

CLAIM OF PRIORITY

The present application claims priority from Japanese patent application JP 2010-071288 filed on Mar. 26, 2010, the content of which is hereby incorporated by reference into this application.

FIELD OF THE INVENTION

The present invention relates to an output buffer circuit, which buffer-outputs internally generated signals, and a driver circuit using the output buffer circuit. In particular, the invention relates to a driver circuit that is suitably used in pin electronics, and an output buffer circuit that is suitably used in the driver circuit.

BACKGROUND OF THE INVENTION

Conventional output buffer circuits intended to reduce power consumption include complementary operation-type output buffer circuits, where an output-stage NPN transistor and an output-stage PNP transistor operate in a complementary manner depending on the transition direction of an input signal (for example, see JP-A-Hei01-4106).

SUMMARY OF THE INVENTION

FIG. 2 is a diagram showing a schematic configuration of a driver circuit for use in pin electronics contemplated by the present inventors on their own prior to the present invention. In FIG. 2, a signal level generation circuit 100 has the function of generating, changing, and outputting VH, VT, and VL having any levels on the basis of combinations of control signals INA and ENA. It provides the output signals to an external device to be measured through an output buffer circuit 110. The output buffer circuit 110 has the function of rapidly driving a signal line 120 connected to an external device DUT 140 to be measured in a manner corresponding to a change in an output signal of the signal level generation circuit 100. A resistor element 130 between the output buffer circuit and the signal line is a terminator resistor for obtaining impedance-matching between the output impedance of the driver circuit and the impedances of the transmission line 120 and the DUT 140.

FIG. 3 shows the configuration of the complementary operation-type output buffer circuit according to JP-A-Hei01-4106, which is intended to reduce power consumption. Its input stage has a circuit configuration where an emitter-follower circuit composed of a bias current source 52 and an NPN transistor QN11, which operates at given bias current, and an emitter-follower circuit composed of a bias current source 51 and a PNP transistor QP21, which operates at given bias current, are disposed in parallel. Its output stage is composed of an NPN transistor QN12 and a PNP transistor QP22 whose emitters are connected to each other. The emitter output of the input-stage transistor QN11 is connected to the base input of the output-stage transistor QP22, and the emitter output of the input-stage transistor QP21 is connected to the base input of the output-stage transistor QN12.

While an input signal BIN rapidly changes from a low voltage level to a high voltage level, the transistor QP21 operates to be turned off. Thus, the base potential of the output-stage transistor QN12 increases until the transistor QP21 is turned on again by the bias current source 51. During this period, the transistor QN12 obtains a large base-emitter voltage and flows current into the transmission line 120 using a power supply VCC, raising the output potential. In contrast, while the input signal BIN rapidly changes from a high voltage level to a low voltage level, the transistor QN11 operates to be turned off. Thus, the base potential of the output-stage transistor QP22 decreases until the transistor QN11 is turned on again by the bias current source 52. The transistor QP22 obtains a large emitter-base voltage and draws current from the transmission line 120 into the power supply VEE, lowering the output potential. As seen above, the output buffer circuit is a circuit where the transistors QN12 and QP22 operate in a complimentary manner depending on the transition direction of the input signal BIN. Generally, there is no large difference among the base-emitter voltages of the NPN transistors QN11 and QN12 and the PNP transistors QP21 and QP22. Accordingly, the complementary operation-type output buffer circuit has a buffer circuit configuration where the voltage level of the input signal BIN is reflected on an output signal BOUT.

Since the driver circuit 200 needs to transmit a signal to the DUT 140 rapidly, the output buffer circuit 110 and the DUT 140 are connected to each other when obtaining impedance-matching therebetween. In rapid transmission, matching is generally obtained between low characteristic impedances. Accordingly, the output buffer circuit needs to drive the transmission line 120 having a low characteristic impedance while maintaining an output signal level corresponding to an input signal. This necessarily increases the sizes of the transistors QN12 and QP22.

As the size of a transistor increases, the input capacitance thereof increases as well. Thus, if a high slew rate is required, the input-stage emitter-follower circuit needs to provide current to the bases of the output-stage transistors QN12 and QP22, as well as needs to provide current for rapidly charging or discharging the input capacitances of the QN12 and QP22. To raise the driving power of the emitter-follower circuit requires increases in current of the bias current sources 51 and 52. To constantly increase current increases current consumption, as well as increases the sizes of the transistors QN11 and QP21 of the emitter-follower circuit. This may increase the input capacitance of the output buffer circuit, conversely deteriorating the slew rate.

For this reason, there is a circuit technology that increases the bias current during transition of an input signal by using the fact that the collector currents of the transistors QN11 and QP21 of the input-stage emitter-follower circuit of the output buffer circuit change in a manner corresponding to a rapid change in the input signal BIN, monitoring the collector current of the transistor QN11 or QP21, and adding a control circuit that changes the bias current depending on the collector current and that operates the transistors at usual bias current during a period other than the input signal transition period, as described in JP-A-Hei01-4106.

However, the bias current of the output-stage emitter-follower circuit of the output buffer circuit is changed depending on a variation in the collector current of the input stage emitter-follower circuit thereof. Accordingly, an increase in bias current for compensating for current that drives the base input of the output-stage transistor slightly lags behind the transient response of an output of the emitter-follower circuit. In particular, if a high slew rate is required and if the level change and amplitude of an input or output signal are small, the influence of this delay is increased, hampering an increase in slew rate, since the transient period of the signal change is short.

To increase the slew rate even in a case where a change in input signal level is small, the inventors contemplated a circuit as shown in FIG. 4 prior to this application. The purpose of increasing the bias current source 51 or 52 of the emitter-follower circuit of the output buffer circuit during transition of an input or output signal is the same as that of the above-mentioned related art. However, instead of monitoring the collector current of the input-stage emitter-follower circuit and feeding back the result of the monitoring to the bias current, AC coupling capacitances C1 and C2 are connected to the input signal BIN of the output buffer circuit, and a change in input signal is monitored on the basis of outputs of the C1 and C2 to change the bias current.

While the input signal level rapidly changes from a low voltage level to a high voltage level, the transistor QP21 operates to be turned off. Thus, the base potential of the output-stage transistor QN12 is increased by the bias current source 51 until the transistor QP21 is turned on again. During this period, the rising edge of the input signal temporarily raises the emitter potential of a transistor QP20 forming the bias current source 51 through the AC coupling capacitance C1. Thus, the difference in voltage between the emitter and the base of the QP20 is increased, and the bias current source 51 charges the input capacitance of the transistor QN12 in a state where current is increased compared with that in a steady state. This accelerates the rising edge of the base potential of the QN12.

While the input signal level rapidly changes from a high voltage level to a low voltage level, the transistor QN11 operates to be turned off. Thus, the base potential of the transistor QP22 is lowered by the bias current source 52 until the transistor QN11 is turned on again. During this period, the falling edge of the input signal temporarily lowers the emitter potential of a transistor QN10 forming the bias current source 52 through the AC coupling capacitance C2. Thus, the difference in voltage between the emitter and the base of QN10 is increased, and the bias current source 52 releases electric charge from the input capacitance of the transistor QP22 in a state where current is increased compared with that in a steady state. This accelerates the falling edge of the base potential of the QP22.

To cause the output-stage transistor to operate rapidly, it is preferable to provide current for rapidly charging or discharging the input capacitance of the output-stage transistor during transition of an input or output signal. Since such current is provided by the bias current source of the input-stage emitter-follower circuit, it is preferable to increase the amount of current in the bias current source during transition compared with that in a steady state. In the case of the contemplated circuit shown in FIG. 4, to increase the amount of bias current requires increases in the AC coupling capacitances C1 and C2. However, these capacitances are elements for increasing the input capacitance of the output buffer circuit. To prevent deterioration of the slew rate requires an increase in the driving current of the preceding-stage circuit, that is, the signal level generation circuit 100. However, this increases current consumption. Moreover, depending on the configuration of the signal level generation circuit 100, a load increase caused by an element size increase due to an increase in the driving current may conversely deteriorate the slew rate.

In order to solve the above-mentioned problems, an object of the present invention is to provide a driver circuit that temporarily increases the bias current to be supplied to the transistors forming the output buffer circuit without causing a delay during transition of an input or output signal without significantly increasing the input capacitance of the output buffer circuit, that is, the output load of the signal level generation circuit 100 so that the driver circuit operates at a high slew rate.

A typical example of the present invention is as follows.

An output buffer circuit according to one aspect of the present invention includes: an output buffer including an output stage where an NPN transistor and a PNP transistor are connected to each other in series between first and second power supplies, where emitters of the NPN and PNP transistors are used as output terminals, and where the NPN and PNP transistors operate in a complementary manner; a prebuffer that drives the output buffer; and a replica buffer formed by imitating the prebuffer. Input bias current to be supplied to the transistors of the output stage of the output buffer is increased on the basis of output current of the replica buffer during transition of an output signal.

A driver circuit according to another aspect of the present invention includes: a signal level generation circuit; a prebuffer circuit that receives an output-buffer-circuit input signal generated by the signal level generation circuit; and an output buffer circuit that is driven by the prebuffer circuit by receiving an output of the prebuffer circuit. An output-buffer-circuit output signal is transmitted to a device to be measured by driving an external transmission line using the output buffer circuit. The output buffer circuit includes: an output buffer including an output stage where an NPN transistor and a PNP transistor are connected to each other in series between first and second power supplies, where emitters of the NPN and PNP transistors are used as output terminals, and where the NPN and PNP transistors operate in a complementary manner; a prebuffer that drives the output buffer; and a replica buffer formed by imitating the prebuffer. Input bias current to be supplied to the transistors of the output stage of the output buffer is increased on the basis of output current of the replica buffer during transition of an output signal.

According to the present invention, the bias current to be supplied to the transistors forming the output buffer circuit is temporarily increased on the basis of an output of the replica circuit during transition of an input or output signal. This makes it possible to provide an output buffer circuit that obtains a high slew rate while suppressing constant increase in bias current in the entire output buffer circuit.

DETAILED DESCRIPTION OF THE PREFERRED EMBODIMENTS

Figure 1:
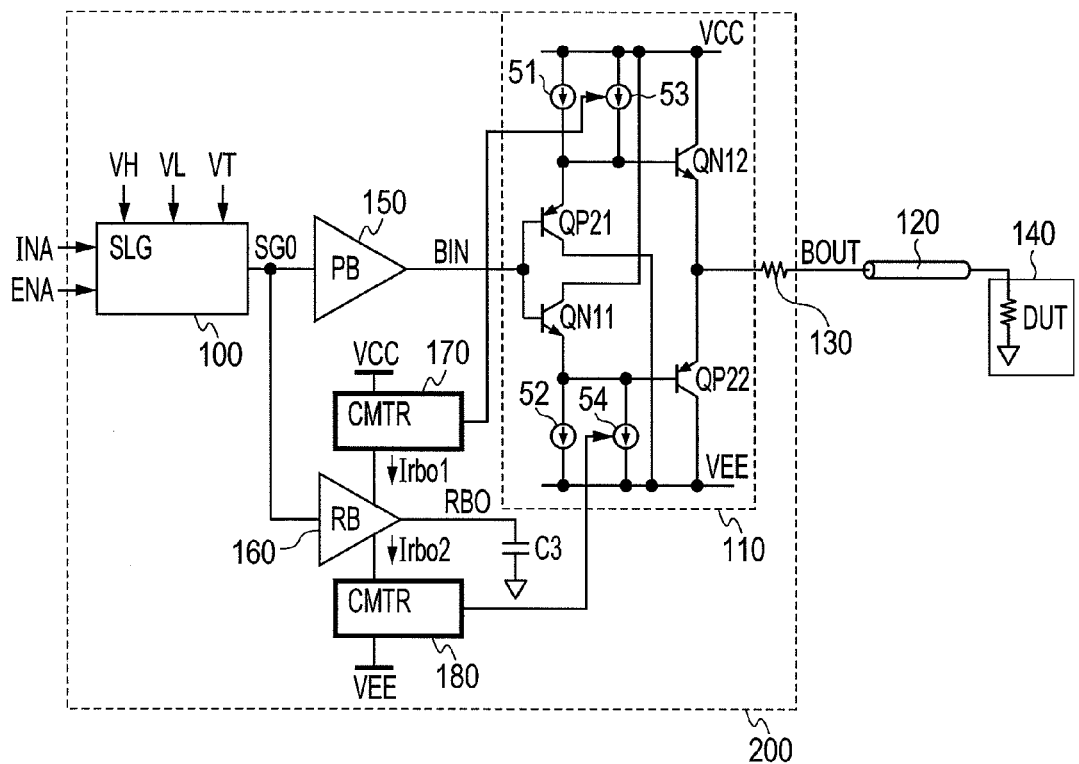
FIG. 1 is a diagram showing the block configuration of a driver circuit according to a first embodiment of the present invention.
Figure 2:
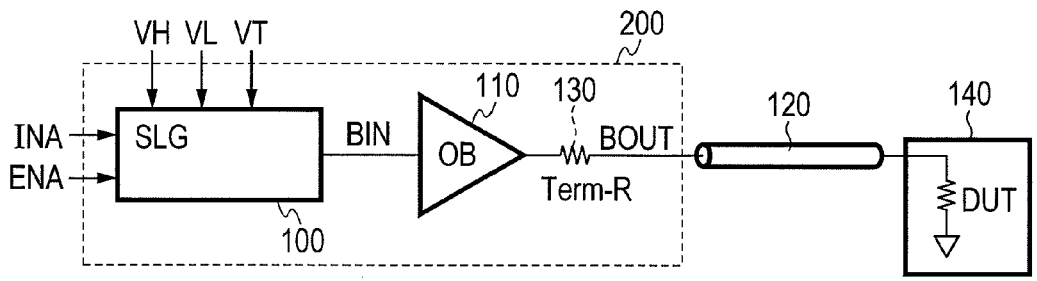
FIG. 2 is a diagram showing a schematic block configuration of a driver circuit for use in pin electronics contemplated by the inventors prior to the present invention.
Figure 3:
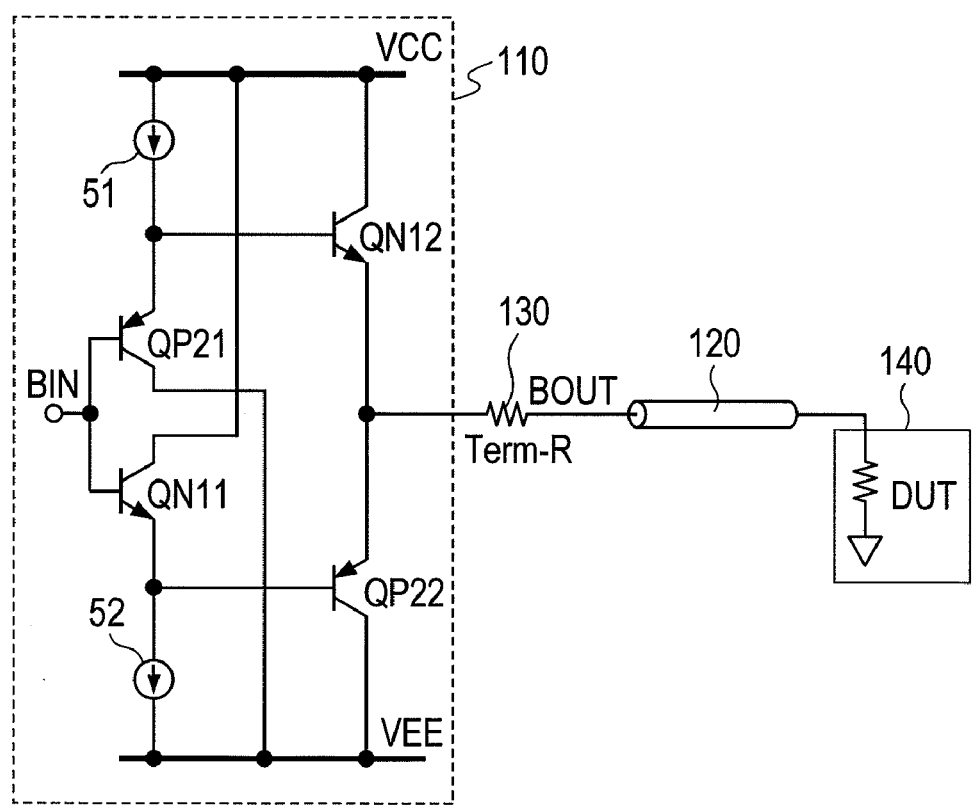
FIG. 3 is a diagram showing the basic circuit configuration of an output buffer according to the related art.

An output buffer circuit according to an embodiment of the present invention includes an output buffer, and a signal supply circuit and a replica circuit thereof disposed in parallel with the output buffer. The output buffer circuit temporarily increases the bias current to be supplied to transistors forming the output buffer on the basis of an output of the replica circuit during transition of an input or output signal.

More specifically, the output buffer circuit according to the embodiment of the present invention includes an output buffer, a prebuffer, and a replica buffer. The output buffer includes an output stage where an NPN transistor and a PNP transistor are connected to each other in series between first and second power supplies, where the emitters of the NPN and PNP transistors are used as output terminals, and where the NPN and PNP transistors operate in a complementary manner. The prebuffer drives the output buffer. The replica buffer is formed by imitating the prebuffer.

The output buffer circuit according to the embodiment of the present invention increases the input bias current to be supplied to the output-stage transistors on the basis of the output current of the replica buffer during a change in output signal. This configuration is advantageous in that the slew rate increases.

The output buffer circuit according to the embodiment of the present invention having the above-mentioned configuration is preferably configured so that the replica buffer and the prebuffer operate in accordance with a common input signal. In this case, it is preferable to configure so that the replica buffer consumes less current and has a smaller element size than the prebuffer.

The output buffer circuit according to the embodiment of the present invention having the above-mentioned configuration is preferably configured so that the replica buffer is composed of a replica buffer for output signal waveform rising edge and a replica buffer for output signal waveform falling edge provided separately. In this case, the waveform of the input bias current of the output-stage NPN transistor of the output buffer is controlled using the output current of the replica buffer for output signal waveform rising edge, and the waveform of the input bias current of the output-stage PNP transistor of the output buffer is controlled using the output current of the replica buffer for output signal waveform falling edge.

A driver circuit according to another embodiment of the present invention includes a signal level generation circuit, a prebuffer circuit, and an output buffer circuit. It transmits an output-buffer-circuit output signal to a device to be measured by driving an external transmission line using the output buffer circuit. The prebuffer circuit receives an output-buffer-circuit input signal generated by the signal level generation circuit. The output buffer circuit is driven by the prebuffer circuit by receiving an output of the prebuffer circuit, and has one of the above-mentioned characteristics of the output buffer circuit according to the present invention.

Now, the embodiments of the present invention will be described in detail with reference to the accompanying drawings.

First Embodiment

FIG. 1 is a block diagram showing the configuration of a driver circuit according to a first embodiment of the present invention. A driver circuit 200 includes a signal level generation circuit 100, a prebuffer circuit 150, which receives an output-buffer-circuit input signal SGO generated by the signal level generation circuit 100, and an output buffer circuit 110, which is driven by the prebuffer circuit 150 by receiving an output of the prebuffer circuit 150. The driver circuit 200 transmits an output-buffer-circuit output signal BOUT to a device DUT 140 to be measured by driving an external transmission line 120 using the output buffer circuit 110. In FIG. 1, the signal level generation circuit 100 and the output buffer circuit 110 are connected via the prebuffer circuit 150. The prebuffer circuit 150 is an explicit representation of a circuit that drives the output buffer circuit 110, and an output buffer included in the conventional signal level generation circuit 100 is also used in the same way. The prebuffer circuit 150 and an imitation thereof, replica buffer circuit 160, are disposed in parallel. The output SGO of the signal level generation circuit 100 is provided to the prebuffer circuit 150 and the replica buffer circuit 160 as a common signal. The replica buffer circuit 160 includes a bias current control circuit that performs the control of the input bias current of output-stage transistors QN12 and QP22 of the output buffer circuit 110. Such control is required during transition of an input or output signal of the output buffer circuit 110 caused by a change in the output SGO of the signal level generation circuit 100.

As with the prebuffer circuit 150, the replica buffer circuit 160 operates while following a change in the input signal SGO. However, a load capacitance C3 is connected to an output RBO of the replica buffer circuit 160. Accordingly, charging or discharging of the load capacitance C3 significantly changes output-stage currents Irbo1 and Irbo2. The output currents Irbo1 and Irbo2 are monitored by monitoring circuits 170 and 180, respectively, and the monitoring results are reflected on the bias currents of bias circuits 53 and 54. Thus, the bias current to be supplied to the output-stage transistors of the output buffer circuit 110 is increased during transition of an input or output signal.

The replica buffer circuit 160 does not need the capability of driving an output load equivalent to that of the prebuffer circuit or the output buffer circuit. Accordingly, the signal path output stage current and the size of the output-stage transistor of the replica buffer circuit 160 can be significantly reduced compared with those of the prebuffer circuit. Moreover, the input load of the replica buffer circuit is negligible and the current value of the entire driver circuit 200 can be significantly reduced compared with that in the related art.

Figure 4:
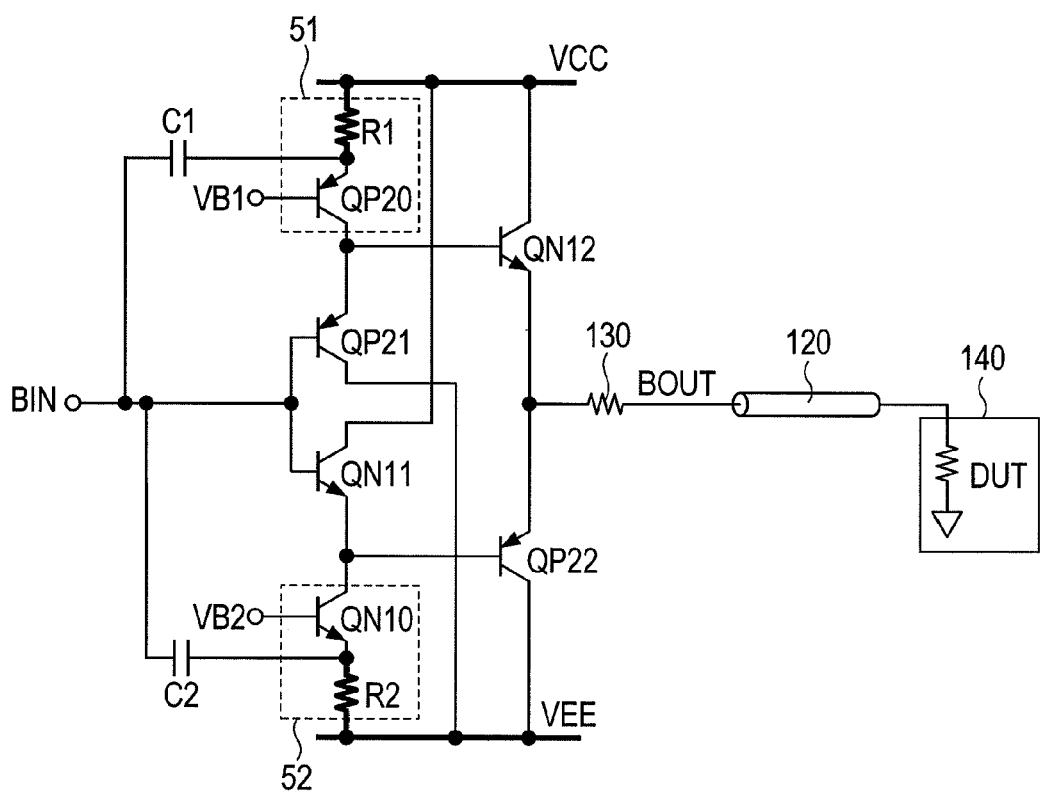
FIG. 4 is a diagram showing the basic circuit configuration of an output buffer to which the related speed-up technology is applied.

These can eliminate the need to control the bias current by connection of the AC coupling capacitances to the input signal BIN in the conventional output buffer circuit 110 as shown in FIG. 4 or can significantly reduce the capacitance value. An increase in the current of the prebuffer circuit 150 can also be suppressed.

Figure 6:
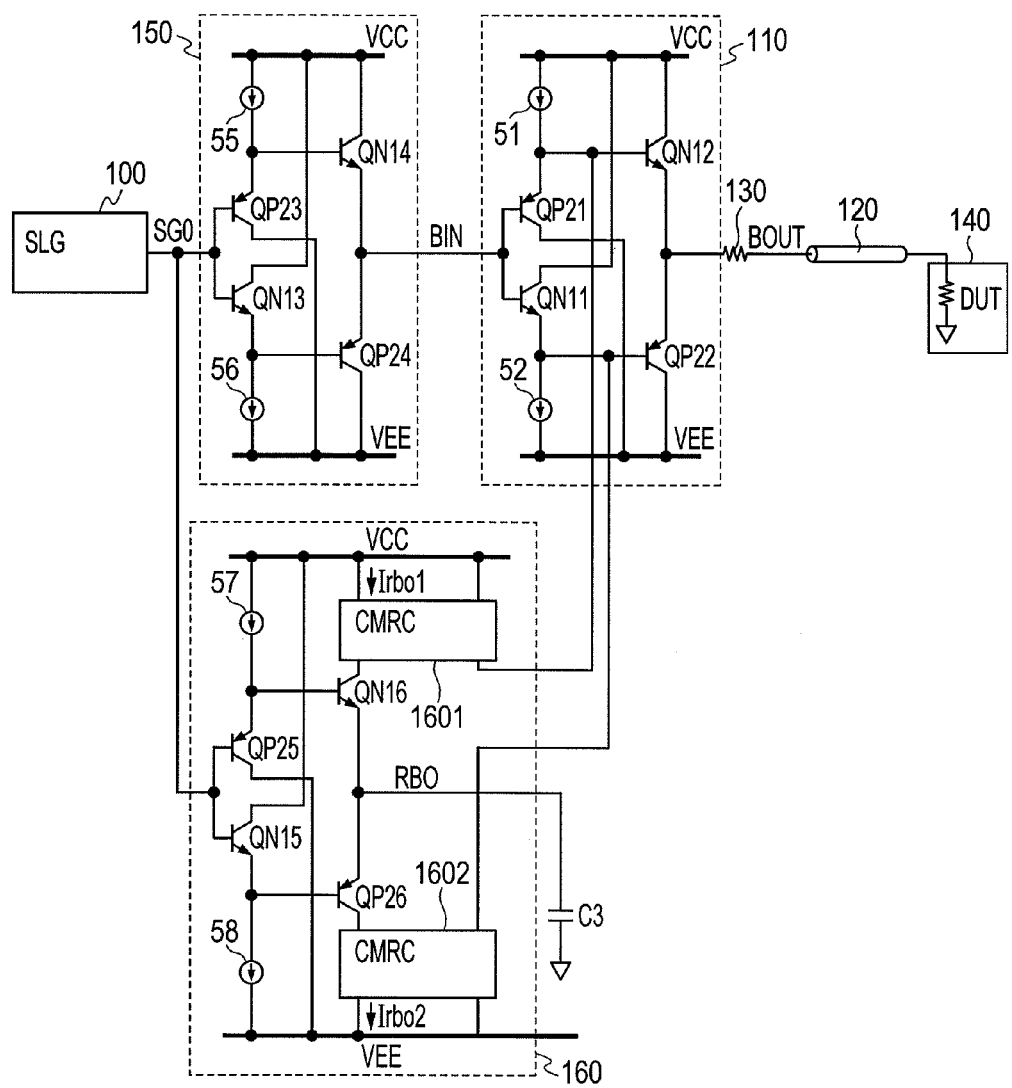
FIG. 6 is a diagram showing an example actual circuit configuration of the driver circuit according to the first embodiment.

FIG. 6 shows an example actual circuit configuration of the driver circuit according to this embodiment. As in the output buffer circuit 110, the prebuffer circuit 150 is an example where the input stage is composed of an emitter-follower circuit including an NPN transistor as its input and an emitter-follower circuit including a PNP transistor as its input, the emitter-follower circuits being disposed in parallel, and where the output stage is composed of an NPN transistor and a PNP transistor whose emitters are connected to each other. The emitter output of the input-stage NPN transistor QN13 is connected to the base input of the output-stage PNP transistor QP24, and the emitter output of the input-stage NPN transistor QN23 is connected to the base input of the output-stage PNP transistor QP14. Thus, the transistors QN14 and QP24 operate in a complimentary manner depending on the transition direction of the output signal SGO of the signal level generation circuit.

The replica buffer circuit 160 has a circuit configuration similar to that of the prebuffer circuit. A transistor QN16 and a transistor QP26 of its output stage operate in a complementary manner depending on the transition direction of the signal SGO. The load capacitance C3 is connected to the buffer output RBO of the replica buffer circuit 160. When the signal SGO changes, the replica buffer circuit 160, which is following a change in the signal SGO, charges or discharges the load capacitance C3, temporarily causing a significant change in the collector current.

While the signal SGO rapidly changes from a low voltage level to a high voltage level, the transistor QP25 operates to be turned off. Thus, the base potential of the transistor QN16 increases until the transistor QP25 is turned on again by a bias current source 57. During this period, the transistor QN16 obtains a large base-emitter voltage and flows current into the load capacitance C3 using a power supply VCC. At that time, in the output buffer circuit 110, a transistor QP21 is turned off via the prebuffer circuit 150, and the base potential of the transistor QN12 is raised by a bias power supply 51. Accordingly, by copying the collector current Irbo1 of the output-stage transistor QN16 of the replica buffer at an appropriate multiplication ratio using a current mirror circuit 1601 and providing the resultant current to the base of the QN12, the bias current is increased as the Irbo1 changes, rapidly charging the input capacitance of the transistor QN12. This accelerates the rising edge of the base potential of the QN12, increasing the slew rate of the output rising edge.

While the signal SGO rapidly changes from a high voltage level to a low voltage level, the transistor QN15 operates to be turned off. Thus, the base potential of the transistor QP26 decreases until the transistor QN15 is turned on again by a bias current source 58. During this period, the transistor QP26 obtains a large base-emitter voltage and draws current from the load capacitance C3 into a power supply VEE. At that time, in the output buffer circuit 110, the transistor QN11 is turned off via the prebuffer circuit 150, and the base potential of the transistor QP22 is lowered by a bias current source 52. Thus, by copying the collector current Irbo2 of the output-stage transistor QP26 of the replica buffer circuit at an appropriate multiplication ratio using a current mirror circuit 1602 and providing the resultant current to the base of the QP22, the bias current is increased as the Irbo2 changes, rapidly releasing electric charge from the input capacitance of QP22. This accelerates the falling edge of the base potential of the QP22, increasing the slew rate of the output falling edge.

Figure 5:
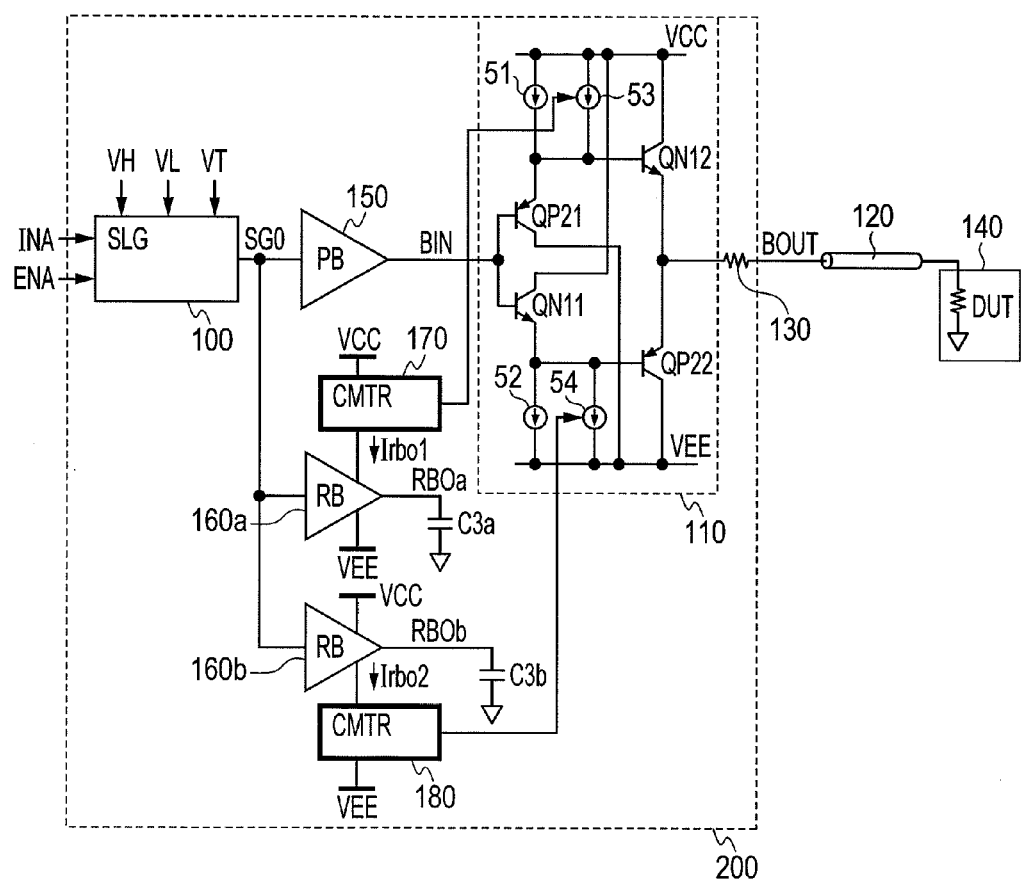
FIG. 5 is a block diagram showing the configuration of a driver circuit according to a second embodiment of the present invention.
Figure 7:
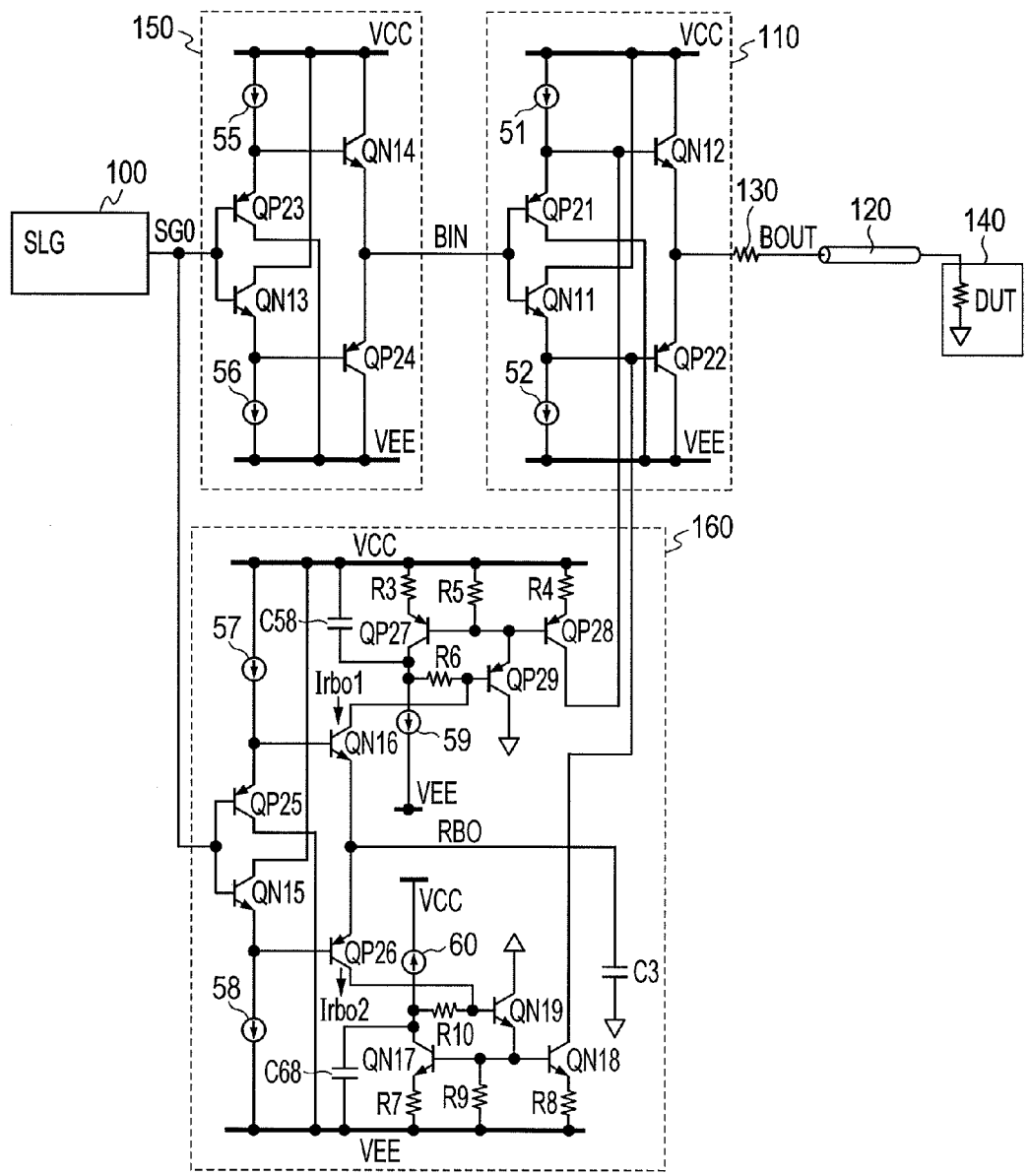
FIG. 7 is a diagram showing another example actual circuit configuration of the driver circuit according to the first embodiment.

FIG. 7 shows another example actual circuit configuration of the driver circuit according to this embodiment. The difference between FIG. 7 and FIG. 6 is that the monitoring circuits 170 and 180 in the replica buffer circuit 160 and the input bias current supply sources 54 and 55 to the output buffer circuit 110 shown in FIG. 5 are not the simple current mirror circuits 1601 and 1602 shown in FIG. 6 and but the circuit that can slightly modulate the bias current corresponding to a current change in an output of the replica buffer circuit.

While the signal SGO rapidly changes from a low voltage level to a high voltage level, the collector current Irbo1 of the output-stage transistor QN16 of the replica buffer increases. Due to a resistor R6 inserted between the base node of a transistor QP29 for compensating for the base currents of a current mirror circuit between a transistor QP27 with a resistor R3 and a transistor QP28 with a resistor R4 and the collector node of the QR27, the base potential of the QP29 is lowered as the current Irbo1 increases. The base potentials of the QP27 and the QP28 decrease while following the base potential of the QP29. This increases the collector current of the QP28, increasing the bias current to be supplied to the output-stage transistor QN12 of the output buffer circuit 110.

While the signal SGO rapidly changes from a high voltage level to a low voltage level, the collector current Irbo2 of the output-stage transistor QP26 of the replica buffer increases. Due to a resistor R10 inserted between the base node of the transistor QN19 for compensating for the base currents of a current mirror circuit between a transistor QN17 with a resistor R7 and a transistor QN18 with a resistor R8 and the collector node of the QN17, the base potential of the QN19 is raised as the current Irbo2 increases. The base potentials of the QN17 and the QN18 increase while following the base potential of the QN19. This increases the collector current of the QN18, increasing the bias current to be supplied to the output-stage transistor QP22 of the output buffer circuit 110.

Second Embodiment

FIG. 5 is a block diagram showing the configuration of a driver circuit according to another embodiment, second embodiment, of the present invention. While the replica buffer is commonly used in the first embodiment shown in FIG. 1, this embodiment differs from the first embodiment in that the replica buffer is not commonly used. In FIG. 5, the replica buffer is divided into a replica buffer 160a, which controls the input bias current to the output-stage QN12 having a large effect on the output rising edge, a replica buffer circuit 160b, which controls the input bias current to the output-stage QP22 having a large effect on an output load capacitance C3a and the output falling edge, and an output load capacitance C3b.

According to this embodiment, the replica buffer circuits are provided separately. This is advantageous in that the driver output waveform is easily adjusted for each rising edge and falling edge.

What is claimed is:

1. An output buffer circuit comprising:
   an output stage where an NPN transistor and a PNP transistor are connected to each other in series between first and second power supplies, where emitters of the NPN and PNP transistors are used as output terminals, and where the NPN and PNP transistors operate in a complementary manner;
   a prebuffer that drives the output buffer; and
   a replica buffer formed by imitating the prebuffer,
   wherein input bias current to be supplied to the transistors of the output stage of the output buffer is increased on the basis of output current of the replica buffer during transition of an output signal.

2. The output buffer circuit according to claim 1, wherein the replica buffer and the prebuffer operate in accordance with a common input signal.

3. The output buffer circuit according to claim 2, wherein the replica buffer consumes less current and has a smaller element size than the prebuffer.

4. The output buffer circuit according to claim 3,
   wherein the replica buffer includes a replica buffer for output signal waveform rising edge and a replica buffer for output signal waveform falling edge provided separately,
   wherein a waveform of input bias current of the NPN transistor of the output stage of the output buffer is controlled using output current of the replica buffer for output signal waveform rising edge, and
   wherein a waveform of input bias current of the PNP transistor of the output stage of the output buffer is controlled using output current of the replica buffer for output signal waveform falling edge.

5. A driver circuit comprising:
   a signal level generation circuit;

a prebuffer circuit that receives an output-buffer-circuit input signal generated by the signal level generation circuit; and
an output buffer circuit that is driven by the prebuffer circuit by receiving an output of the prebuffer circuit,
wherein an output-buffer-circuit output signal is transmitted to a device to be measured by driving an external transmission line using the output buffer circuit,
wherein the output buffer circuit includes:
an output buffer having an output stage where an NPN transistor and a PNP transistor are connected to each other in series between first and second power supplies, where emitters of the NPN and PNP transistors are used as output terminals, and where the NPN and PNP transistors operate in a complementary manner;
a prebuffer that drives the output buffer; and
a replica buffer formed by imitating the prebuffer, and
wherein input bias current to be supplied to the transistors of the output stage of the output buffer is increased on the basis of output current of the replica buffer during transition of an output signal.

6. The driver circuit according to claim 5, wherein the replica buffer and the prebuffer operate in accordance with a common input signal.

7. The driver circuit according to claim 6, wherein the replica buffer consumes less current and has a smaller element size than the prebuffer.

8. The driver circuit according to claim 7,
wherein the replica buffer includes a replica buffer for output signal waveform rising edge and a replica buffer for output signal waveform falling edge provided separately,
wherein a waveform of input bias current of the NPN transistor of the output stage of the output buffer is controlled using output current of the replica buffer for output signal waveform rising edge, and
wherein a waveform of input bias current of the PNP transistor of the output stage of the output buffer is controlled using output current of the replica buffer for output signal waveform falling edge.

* * * * *